(12) United States Patent
Kurahashi et al.

(10) Patent No.: US 6,822,266 B2
(45) Date of Patent: Nov. 23, 2004

(54) SEMICONDUCTOR LIGHT-EMITTING DEVICE

(75) Inventors: Takahisa Kurahashi, Kashiba (JP); Hiroshi Nakatsu, Tenri (JP); Tetsurou Murakami, Tenri (JP); Shouichi Ohyama, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 21 days.

(21) Appl. No.: 10/153,874

(22) Filed: May 24, 2002

(65) Prior Publication Data

US 2002/0185653 A1 Dec. 12, 2002

(30) Foreign Application Priority Data

May 24, 2001 (JP) ........................... 2001-155342
Apr. 10, 2002 (JP) ........................... 2002-107922

(51) Int. Cl.$^7$ ............................................. H01L 27/15
(52) U.S. Cl. ................. 257/86; 257/12; 257/13; 257/14; 257/25; 257/436
(58) Field of Search ........................ 257/86, 12, 13, 257/14, 25, 436

(56) References Cited

U.S. PATENT DOCUMENTS 5,226,053 A * 7/1993 Cho et al. ................... 372/45
6,031,243 A * 2/2000 Taylor ......................... 257/13
6,365,427 B1 * 4/2002 Gauggel et al. ............. 438/22
6,546,038 B1 * 4/2003 Mizuno ........................ 372/96

FOREIGN PATENT DOCUMENTS

JP      2001-068732     3/2001

OTHER PUBLICATIONS

"High Brightness Visible (660nm) Resonant–Cavity Light–Emitting Diode" by K. Streubel et al.; *IEEE Photonics Technology Letters*, vol. 10, No. 12 c. 1998.

Mizuno et al., "Micro–Cavity Led with 2 SQWs of Different Width".

* cited by examiner

*Primary Examiner*—Nathan J. Flynn
*Assistant Examiner*—Remmon R. Fordé
(74) *Attorney, Agent, or Firm*—Morrison & Foerster LLP (57) ABSTRACT

A semiconductor light-emitting device includes an active layer having a single quantum well structure. The single quantum well structure enables a high-speed response such that the rise and fall time is 2.1 nsec. Further, the single quantum well active layer is doped with Zn at a concentration of $8 \times 10^{17}$ cm$^{-3}$. Thereby, the half-value width of the light-emitting spectrum is 25 nm or more, which is wider than in the case of no doping. Thus, temperature dependence of an optical output is reduced.

15 Claims, 11 Drawing Sheets

SEMICONDUCTOR LIGHT-EMITTING DEVICE

BACKGROUND OF THE INVENTION

The present invention relates to a semiconductor light-emitting device for use in optical transmissions, displays and so forth.

In recent years, semiconductor light-emitting devices have been widely used for optical communications, information display panels and so forth. In these cases, it is important for the semiconductor light-emitting device to have high light-emitting efficiency. Furthermore, a fast response speed is critical for a semiconductor light-emitting device in optical communications. Semiconductor light-emitting devices having these properties have been increasingly developed in recent years.

A common plane emission-type Light-Emitting Diode (LED) does not have a favorable high-speed response property and is limited to about 100–200 Mbps. Accordingly, a semiconductor light-emitting device, called a resonant cavity-type LED, is being developed. This resonant cavity-type LED is a semiconductor light-emitting device in which a light-emitting layer is positioned at an antinode of a standing wave generated by a resonator formed by two mirrors to control spontaneously emitted light. This achieves a high-speed response with a high degree of efficiency. In particular, a Plastic Optical Fiber (POF) has recently been used for communications over a relatively short distance. A resonant cavity-type LED using an AlGaInP semiconductor material as a light-emitting layer is being developed that enables highly efficient light emission at 650 nm, which is within a low-loss wavelength range of this POF.

However, the aforementioned conventional resonant cavity-type LED has the following problems. The optical output of the resonant cavity-type LED depends on a gain at a resonance wavelength of the aforementioned resonator. The gain thus corresponds to the intensity of a light-emitting spectrum in the light-emitting layer. Therefore, when a peak of the light-emitting spectrum coincides with the resonance wavelength, the optical output is maximized. The optical output decreases as the resonance wavelength is displaced from the peak of the light-emitting spectrum.

The resonance wavelength barely changes even when the temperature changes. However, the emission wavelength from the light-emitting layer largely depends on temperature. That is, as the temperature falls, the emission wavelength becomes shorter. As the temperature rises, the emission wavelength becomes longer. Therefore, the optical output from the resonant cavity-type LED depends on temperature. Furthermore, since the temperature dependence of the optical output from the resonant cavity-type LED is greater than that of a common LED, it is problematic to use the resonant cavity type LED for communications.

Conventionally, to solve the problem of temperature dependence of the optical output from the resonant cavity-type LED, a plurality of quantum well active layers are provided. The well width of each quantum well active layer is changed to increase the gain spectrum width. Consequently, a large gain can be obtained at a resonance wavelength within a wider temperature range.

However, the response speed depends on the number of quantum well layers in the aforementioned resonant cavity-type LED, with independent quantum wells having different widths. Therefore, the response speed is reduced when there are two or more quantum well layers.

Accordingly, an object of the invention is to provide a resonant cavity-type semiconductor light-emitting device having excellent response characteristics and an optical output with little dependence on temperature.

SUMMARY OF THE INVENTION

A first embodiment of the invention provides a semiconductor light-emitting device comprising a resonator having a pair of multilayer reflection films formed on a semiconductor substrate with a predetermined gap therebetween. A quantum well active layer is provided at a position of an antinode of a standing wave generated in the resonator. The quantum well active layer is doped with an impurity.

According to the above constitution, since the quantum well active layer is doped with impurities, a half-value width of a light-emitting spectrum is greater than when the impurities are not doped. The temperature dependence of the optical output is also reduced.

In one embodiment of the semiconductor light-emitting device according to the first aspect of the invention, the quantum well active layer is a single quantum well active layer.

According to this embodiment, since the active layer has a single quantum well structure, a high-speed response can be achieved.

In one embodiment of the semiconductor light-emitting device according to the first aspect of the invention, the impurity is either a p-type impurity or an n-type impurity.

According to this embodiment, the same impurity type used in layers other than the quantum well active layer can be used.

In one embodiment of the semiconductor light-emitting device according to the first aspect of the invention, the concentration of the impurity is $2 \times 10^{17}$ cm$^{-3}$ or higher.

According to this embodiment, the half-value width of the light-emitting spectrum is notably increased in comparison to when the impurities are not doped.

In one embodiment of the semiconductor light-emitting device according to the first aspect of the invention, the impurity includes both a p-type impurity and an n-type impurity.

According to this embodiment, the half-value width of the light-emitting spectrum is greater at a lower concentration of the impurities than when an impurity of either one of the conductive types is doped.

In one embodiment of the semiconductor light-emitting device according to the first aspect of the invention, each concentration of the p-type impurity and the n-type impurity is $7 \times 10^{16}$ cm$^{-3}$ or higher.

According to this embodiment, the half-value width of the light-emitting spectrum is notably increased compared to when the impurities are not doped.

In one embodiment of the semiconductor light-emitting device according to the first aspect of the invention, the p-type impurity can be any one of Zn, Mg, Be and C. The n-type impurity can be any one of Si, Se and Te.

According to this embodiment, the same impurity type used in layers other than the single quantum well active layer can be used.

A second aspect of the invention provides a semiconductor light-emitting device comprising a resonator having a pair of multilayer reflection films formed on a semiconductor substrate with a predetermined gap therebetween. A quantum well active layer is provided at a position of an antinode of a standing wave generated in the resonator. The half-value width of the light-emitting spectrum by the quantum well active layer is 25 nm or greater.

According to the above constitution, since the half-value width of the light-emitting spectrum from the single quantum well active layer is 25 nm or greater, the temperature dependence of the optical output can be reduced.

In one embodiment of the semiconductor light-emitting device according to the second aspect of the invention, the quantum well active layer is a single quantum well active layer.

According to this embodiment, a change in optical output within the temperature range of −20° C. to 70° C. can be restricted to 20% or lower.

A third aspect of the invention provides a semiconductor light-emitting device comprising a resonator having of a pair of multilayer reflection films formed on a semiconductor substrate with a predetermined gap therebetween. A single quantum well active layer is provided at a position of an antinode of a standing wave generated in the resonator. The rate of minimum optical output to the maximum optical output in the temperature range of −20° C. to 70° C. is 0.8 or higher.

According to the above constitution, since an optical output temperature change rate in the optical output within the temperature range of −20 to 70° C. is 20% or lower, this light-emitting device can be used as a light-emitting device for optical transmissions.

In one embodiment of the semiconductor light-emitting device according to the first, second and third aspects of the invention, the semiconductor substrate is a GaAs substrate.

According to this embodiment, since the semiconductor substrate is a GaAs substrate, the light-emitting device can be formed by a material lattice-matched to this GaAs substrate. Therefore, increased light-emitting efficiency can be obtained.

In one embodiment of the semiconductor light-emitting device according to the first, second and third aspects of the invention, the quantum well active layer is made of $Al_yGa_zIn_{1-y-z}P$ ($0 \leq y \leq 1, 0 \leq z \leq 1$).

According to this embodiment, since the quantum well active layer is formed by $Al_yGa_zIn_{1-y-z}P$ ($0 \leq y \leq 1, 0 \leq z \leq 1$), the emission wavelength is in the range of 550–670 nm.

In one embodiment of the semiconductor light-emitting device according to the first, second and third aspects of the invention, a semiconductor layer including the multilayer reflection film and the single quantum well active layer is formed by a metal organized chemical vapor deposition (MOCVD) method.

According to the above embodiment, since the semiconductor layer including the multilayer reflection film and the single quantum well active layer is formed by the MOCVD method, it is possible to reproduce a favorable film thickness, layer thickness and carrier concentration.

BRIEF DESCRIPTION OF THE DRAWINGS

The present invention will become more fully understood from the detailed description given hereinbelow and the accompanying drawings which are given by way of illustration only, and thus do not limit the present invention.

DETAILED DESCRIPTION OF THE PREFERRED EMBODIMENTS

Embodiments of the present invention are described in detail with reference to the accompanying drawings.

Figure 1A:
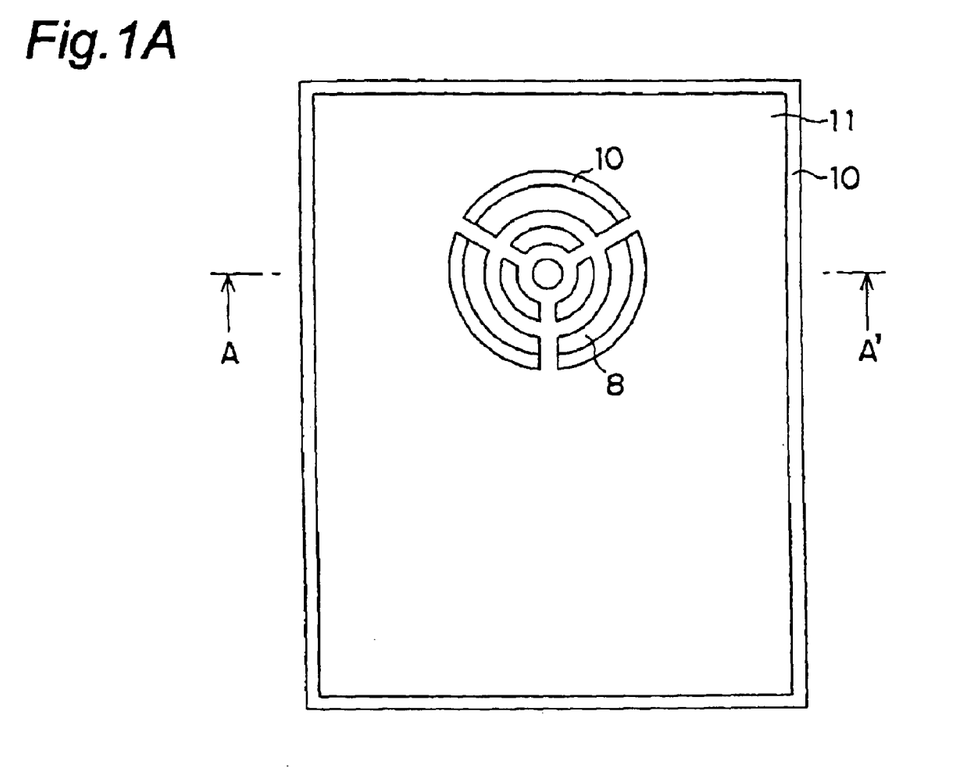
FIGS. 1A and 1B show a semiconductor light-emitting device according to the present invention.
Figure 1B:
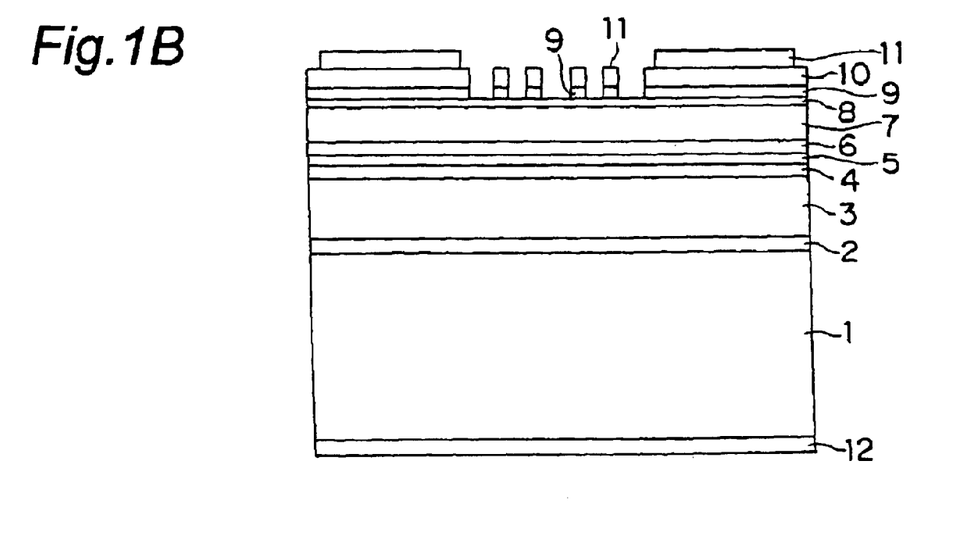

FIGS. 1A and 1B show a semiconductor light-emitting device according to a first embodiment. FIG. 1A is a plan view and FIG. 1B is a cross sectional view along line A–A' shown in FIG. 1A. In FIG. 1B, reference numeral 1 denotes an n-type GaAs substrate. Reference numeral 2 denotes an n-type GaAs buffer layer (1 µm). Reference numeral 3 denotes a DBR (Distributed Bragg Reflector) of 30.5 pairs of n-type AlAs and n-type $Al_{0.5}Ga_{0.5}As$. Reference numeral 4 denotes an n-type $(Al_{0.7}Ga_{0.3})_{0.5}In_{0.5}P$ first clad layer. Reference numeral 5 is a p-type GaInP single quantum well active layer wherein a well layer is $Ga_xIn_{1-x}P$ and a barrier layer is $(Al_{0.5}Ga_{0.5})_{0.5}In_{0.5}P$. Reference numeral 6 is a p-type $(Al_{0.7}Ga_{0.3})_{0.5}In_{0.5}P$ second clad layer. Reference numeral 7 is a DBR of 12 pairs of p-type $(Al_{0.2}Ga_{0.8})_{0.5}In_{0.5}P$ and p-type $Al_{0.5}In_{0.5}P$. Reference numeral 8 is a p-type $(Al_{0.2}Ga_{0.8})_{0.5}In_{0.5}P$ intermediate layer (1 µm). Reference numeral 9 is a p-type GaAs contact layer. Reference numeral 10 is an $SiO_2$ film. Reference numeral 11 is an p-type electrode. Reference numeral 12 is an n-type electrode.

Figure 2:
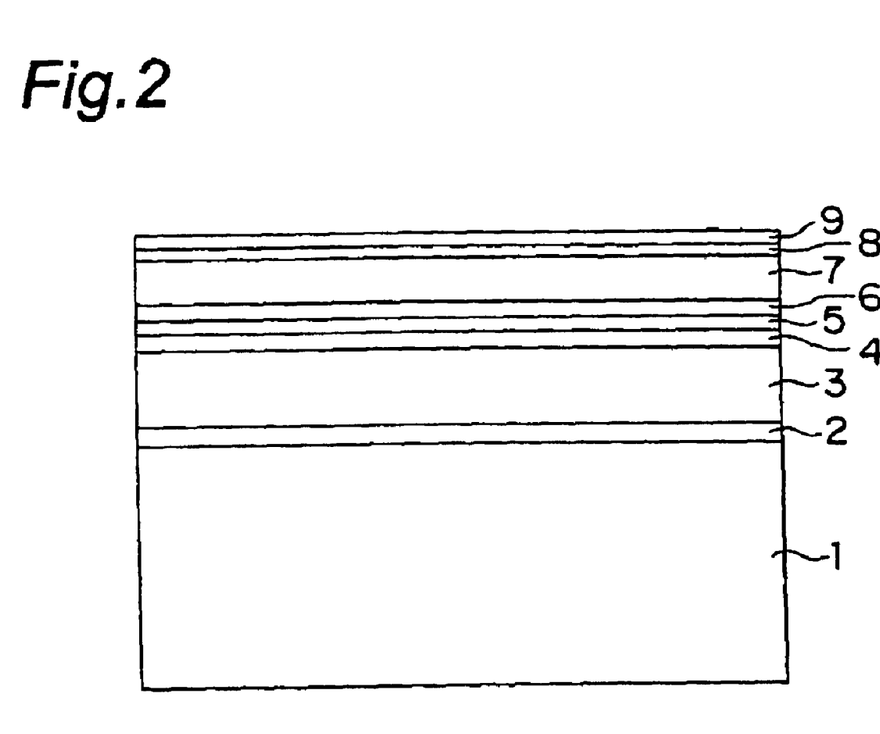
FIG. 2 is a cross sectional view showing a state in which the semiconductor light-emitting device shown in FIGS. 1A and 1B is formed up to a p-type GaAs contact layer.

FIG. 2 is a cross sectional view showing a state in a manufacturing process of the semiconductor light-emitting device shown in FIGS. 1A and 1B in which the n-type GaAs buffer layer 2 to the p-type GaAs contact layer 9 are formed on the n-type GaAs substrate 1. It is noted that this semiconductor light-emitting device is made of AlGaInP. As shown in FIG. 2, the n-type GaAs buffer layer 2 to the p-type GaAs contact layer 9 are successively laminated on the n-type GaAs substrate 1 tilted 2° from a plane orientation (100) in the [011] direction by the MOCVD method.

In the DBR 3 of 30.5 pairs of n-type AlAs and n-type AlGaAs and the DBR 7 of 12 pairs of p-type AlGaInP and p-type AlInP, the center of the reflection spectrum is 650 nm. Furthermore, the resonator length is adjusted so that the resonance wavelength of the resonator formed by the two DBR 3, 7 as the multilayer reflection film is also 650 nm. In this embodiment, the resonator length is set to obtain two wavelengths. Furthermore, the position of the GaInP quantum well active layer 5 is positioned at an antinode of a standing wave generated in the resonator, and the light-emitting peak wavelength is 650 nm. Furthermore, the GaInP single quantum well active layer 5 is doped with $8 \times 10^{17}$ cm$^{-3}$ of Zn.

Figure 3A:
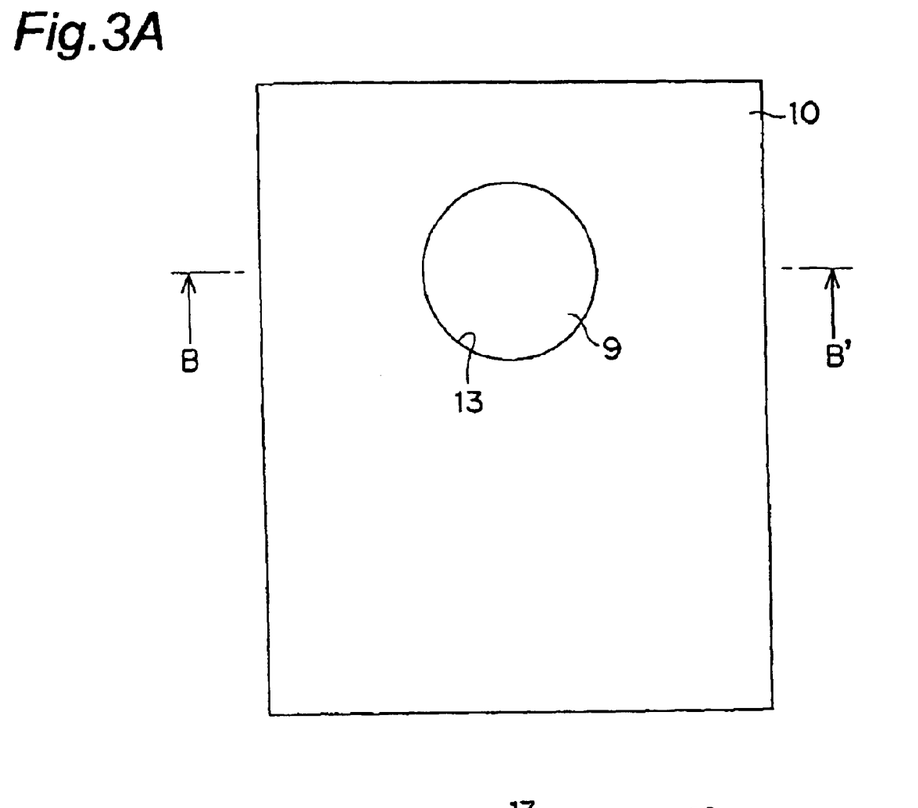
FIGS. 3A and 3B show a state in which an $SiO_2$ film and a current path are formed on the p-type GaAs contact layer shown in FIG. 2.
Figure 3B:
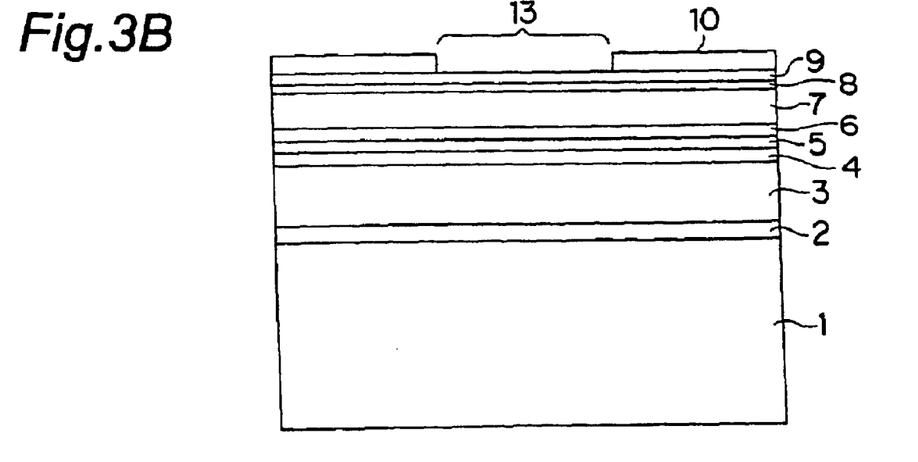

FIGS. 3A and 3B show a state in which the SiO$_2$ film 10 is formed on the p-type GaAs contact layer 9 shown in FIG. 2. It is noted that FIG. 3A is a plan view and that FIG. 3B is a cross sectional view along line B–B' shown in FIG. 3A. After the p-type GaAs contact layer 9 is formed as shown in FIG. 2, the SiO$_2$ film 10 is formed on a wafer surface by a Chemical Vapor Deposition (CVD) method, and a current path 13 in a circular shape of 70 μm φ is formed by photolithography and etching with diluted HF.

As shown in FIGS. 1A and 1B, AuZn/Mo/Au is then sputtered on the p-type GaAs contact layer 9 and the SiO$_2$ film 10. A surface electrode 11 is formed having two rings each having a width of a few μm formed in the current path 13 by patterning with photolithography. The rings are connected by three lines extending in a radial direction from their center towards the SiO$_2$ film 10. Usually, there is only a layer having a thickness of 1–3 μm between the surface electrode formed on the SiO$_2$ film 10 and the light-emitting layer, and current is not diffused in this interlayer. However, by shaping the electrode shape into rings having a width of a few μm, as shown in FIGS. 1A and 1B, current can be injected quite uniformly into the light-emitting portion. Therefore, emission light, which is blocked by the surface electrode (11) and cannot be removed, can be restricted. The p-type electrode 11 can thus be obtained by thermal treatment.

Subsequently, the exposed surface of the n-type GaAs substrate 1 is polished to a thickness of about 280 μm. The n-type electrode 12 is formed by depositing AuGe/Au on the polished surface and performing a thermal treatment. Thus, the semiconductor light-emitting device shown in FIGS. 1A and 1B is completed.

The semiconductor light-emitting device having the above constitution was subjected to a 50-mA electrification test in an atmosphere at a temperature of 80° C. and a humidity of 85%. After 1000 hours, the obtained optical output was 90% of the initial optical output. Furthermore, due to the current constriction structure by the current path 13 having a circular shape of 70 μm φ and the ring-shaped p-type electrode 11 formed in this current path 13, both the internal quantum efficiency and external outgoing efficiency were high. The initial optical output was 1.6 mW at 30 mA. Therefore, an optical output sufficient to perform optical communications by using POF was obtained.

Furthermore, regarding the response characteristics, the rise and fall time was 2.1 nsec when the GaInP single quantum well active layer 5 was doped with Zn, which was equivalent to 2.2 nsec in the case in which Zn was not doped.

Figure 4:
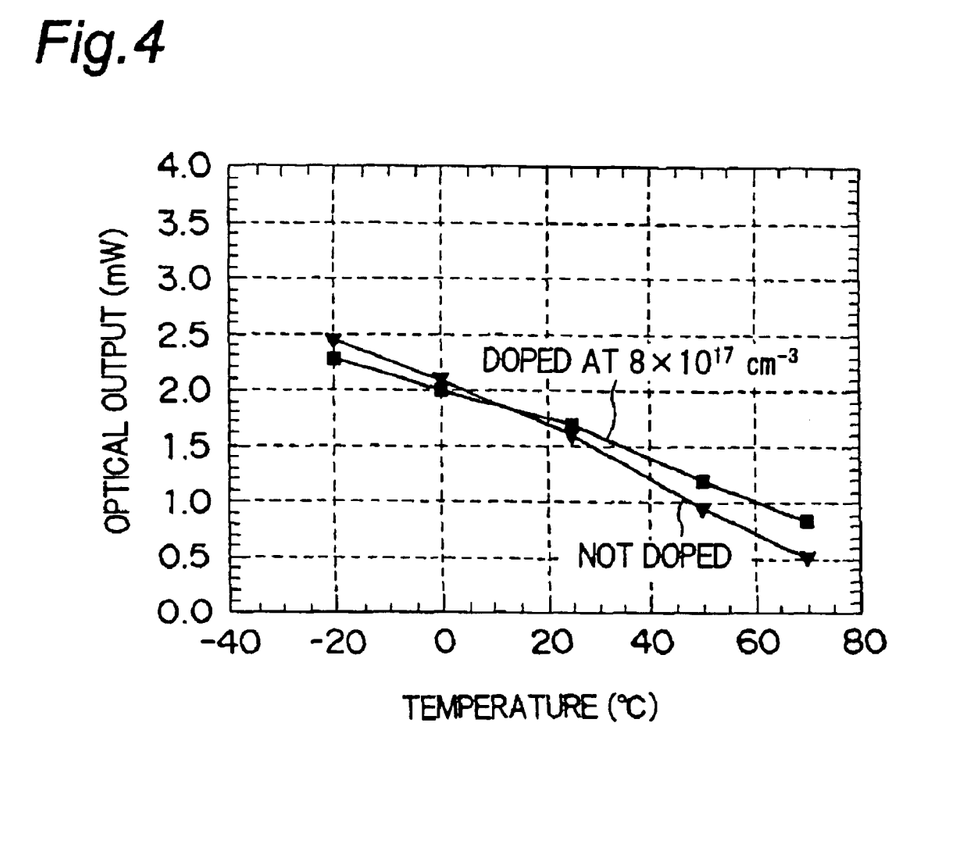
FIG. 4 shows the temperature dependence of the optical output of the semiconductor light-emitting device shown in FIG. 1.

Meanwhile, if the doping concentration is $2 \times 10^{17}$ cm$^{-3}$ or higher when the GaInP single quantum well active layer 5 is doped with Zn, the half-value width of the light-emitting spectrum begins to increase. Furthermore, when the Zn concentration is $8 \times 10^{17}$ cm$^{-3}$, the half-value width of the light-emitting spectrum from the GaInP single quantum well active layer 5 is about 30 nm, which is about twice as high as in the case in which the Zn is not doped (15 nm). Consequently, as shown in FIG. 4, it is evident that the rate of optical output at −20° C. to the optical output at 70° C. is improved from 1/5, in the case in which Zn is not doped, to 1/3.

As described above, in this embodiment, the n-type GaAs buffer layer 2, DBR 3 of 30.5 pairs of n-type AlAs and n-type AlGaAs, n-type AlGaInP first clad layer 4, GaInP single quantum well active layer 5, p-type AlGaInP second clad layer 6, DBR 7 of 12 pairs of p-type AlGaInP and p-type AlInP, p-type AlGaInP intermediate layer 8 and p-type GaAs contact layer 9 are successively laminated on the n-type GaAs substrate 1 by the MOCVD method.

At this time, the resonator length is adjusted so that the center of the reflection spectrum of both the DBR 3, 7 is 650 nm. The resonance wavelength of the resonator formed by these two DBR 3, 7 is also 650 nm. Furthermore, the GaInP single quantum well active layer 5 is positioned at an antinode of the standing wave generated in the resonator and the light-emitting peak wavelength is 650 nm. Furthermore, the GaInP single quantum well active layer 5 is doped with $8 \times 10^{17}$ cm$^{-3}$ of Zn.

Furthermore, an SiO$_2$ film 10 is formed by the CVD method. A current path 13 having a circular shape of 70 μm φ is formed on the SiO$_2$ film 10. Then, a p-type electrode 11 is formed into two rings having a width of a few μm formed in the current path 13 and connected by lines extending in the radial direction. Furthermore, an n-type electrode 12 is formed on the exposed surface of the n-type GaAs substrate 1.

Thus, since the active layer 5 has a single quantum well structure, the rise and fall time is 2.1 nsec. Hence, a high-speed response can be achieved. Furthermore, since the GaInP single quantum well active layer 5 is doped with Zn at a concentration of $8 \times 10^{17}$ cm$^{-3}$, which is a concentration of $2 \times 10^{17}$ cm$^{-3}$ or higher, the half-value width of the light-emitting spectrum can be increased to 25 nm or greater compared to when Zn is not doped. Therefore, the temperature dependence of the optical output can be reduced.

In this embodiment, Zn is used as a p-type impurity to be doped into the GaInP quantum well active layer 5. However, the same effect can be obtained by using Mg, Be, C or the like. Therefore, by using the same impurity type, which is not limited to only Zn, used in layers other than the GaInP quantum well active layer 5, the number of kinds of impurities can be reduced.

In this embodiment, a single quantum well active layer structure, wherein the number of well layers is 1, is adopted as a quantum well active layer. However, a reduction in temperature dependence of the optical output can be similarly obtained when the number of well layers is 2 or more.

Figure 5A:
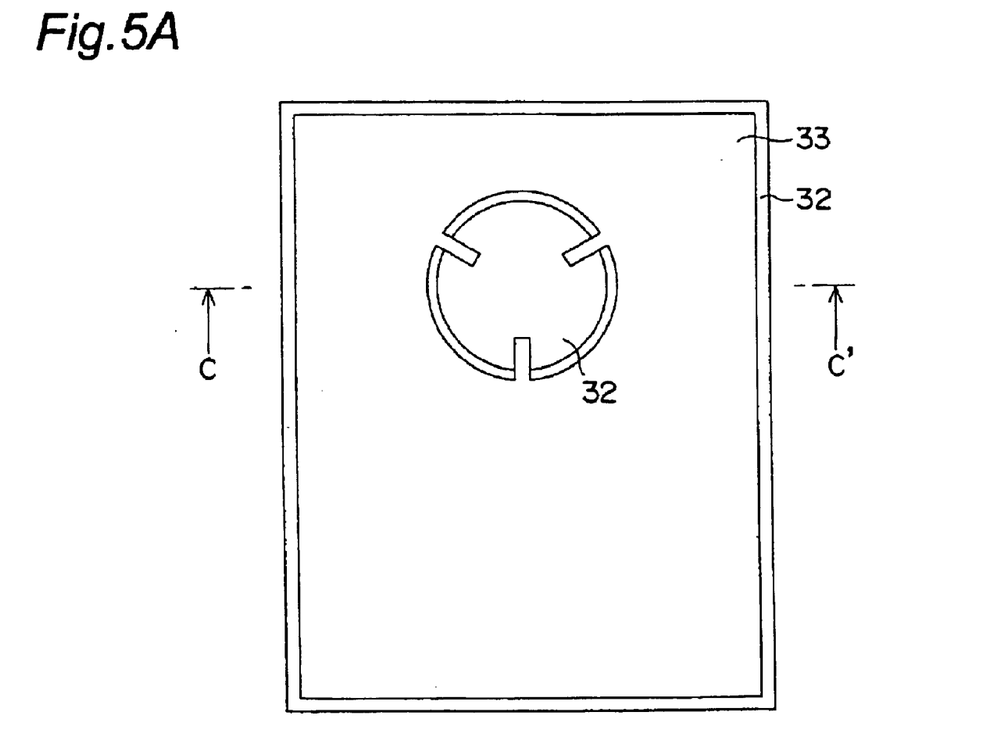
FIGS. 5A and 5B show a semiconductor light-emitting device of another embodiment of the invention.
Figure 5B:
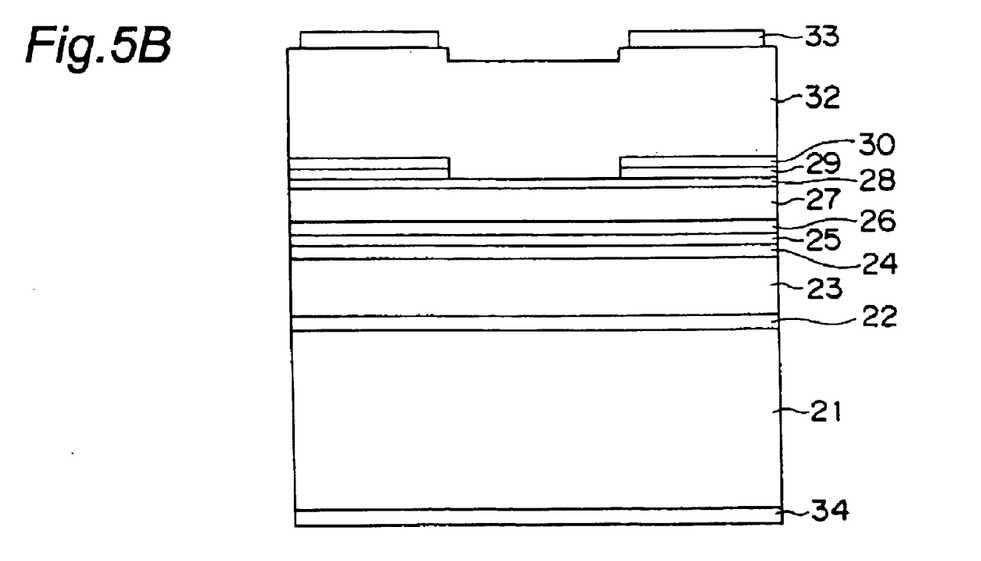

FIGS. 5A and 5B show a semiconductor light-emitting device according to a second embodiment. FIG. 5A is a plan view and FIG. 5B is a cross sectional view along line C–C' shown in FIG. 5A. In FIG. 5B, reference numeral 21 denotes an n-type GaAs substrate. Reference numeral 22 denotes an n-type GaAs buffer layer (1 μm). Reference numeral 23 denotes a DBR of 30.5 pairs of n-type AlAs and n-type Al$_{0.5}$Ga$_{0.5}$As. Reference numeral 24 denotes an n-type (Al$_{0.7}$Ga$_{0.3}$)$_{0.5}$In$_{0.5}$P first clad layer. Reference numeral 25 denotes an n-type GaInP single quantum well active layer wherein a well layer is Ga$_x$In$_{1-x}$P and a barrier layer is (Al$_{0.5}$Ga$_{0.5}$)$_{0.5}$ In$_{0.5}$P Reference numeral 26 is a p-type (Al$_{0.7}$Ga$_{0.3}$)$_{0.5}$In$_{0.5}$P second clad layer. Reference numeral 27 denotes a DBR of 12 pairs of p-type (Al$_{0.2}$Ga$_{0.8}$)$_{0.5}$In$_{0.5}$P and p-type Al$_{0.5}$In$_{0.5}$P. Reference numeral 28 denotes a p-type (Al$_{0.2}$Ga$_{0.8}$)$_{0.5}$In$_{0.5}$P etching stop layer (0.5 μm). Reference numeral 29 denotes an n-type GaAs current constriction layer (0.3 μm). Reference numeral 30 denotes an n-type $(Al_{0.3}Ga_{0.7})_{0.5}In_{0.5}P$ protection layer (0.1 μm). Reference numeral 32 denotes a p-type $Al_{0.5}Ga_{0.5}As$ current diffusion layer. Reference numeral 33 denotes a p-type electrode. Reference numeral 34 denotes an n-type electrode.

Figure 6:
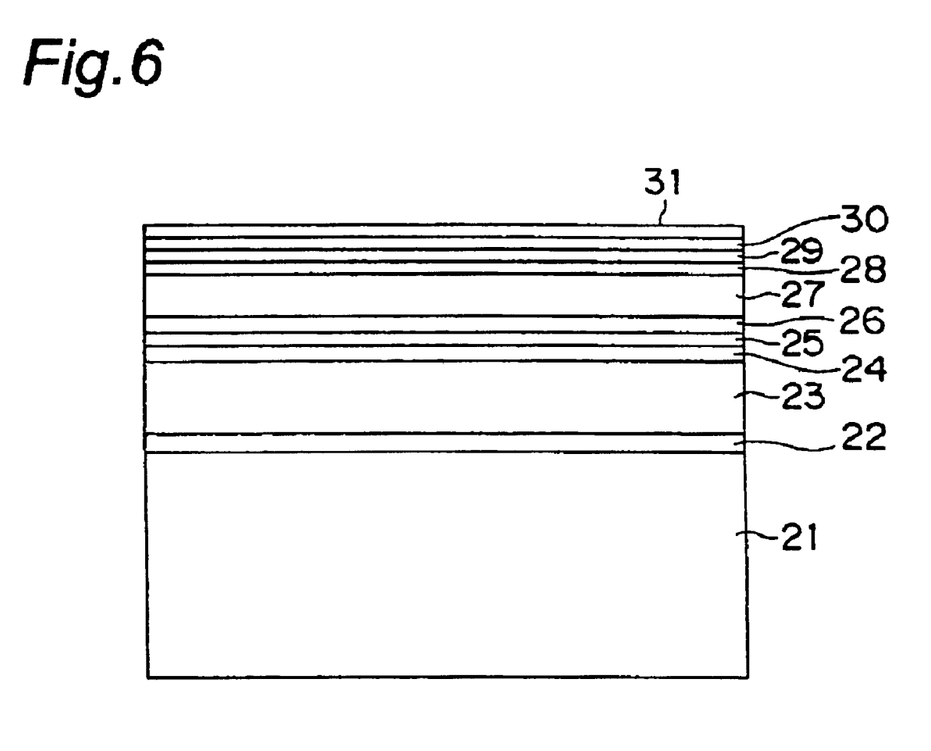
FIG. 6 is a cross sectional view showing a state in which the semiconductor light-emitting device shown in FIGS. 5A and 5B is formed up to an n-type GaAs cap layer.

FIG. 6 is a cross sectional view showing a state in the manufacturing process of the semiconductor light-emitting device shown in FIGS. 5A and 5B in which the n-type GaAs buffer layer 22 to the n-type AlGaInP protection layer 30 are formed on the n-type GaAs substrate 21 and then the n-type GaAs cap layer 31 is formed. It is noted that this semiconductor light-emitting device is made of AlGaInP. As shown in FIG. 6, the n-type GaAs buffer layer 22 to the n-type GaAs cap layer 31 are successively laminated on the n-type GaAs substrate 21 tilted 15° from the plane orientation (100) in the [011] direction by the MOCVD method.

In the DBR 23 of 30.5 pairs of n-type AlAs and n-type AlGaAs and the DBR 27 of 12 pairs of p-type AlGaInP and p-type AlInP, the center of the reflection spectrum is 665 nm. Furthermore, the resonator length is adjusted so that the resonance wavelength of the resonator formed by the two DBR 23, 27 is also 665 nm. In this embodiment, the resonator length is set so as to obtain two wavelengths. Furthermore, the GaInP single quantum well active layer 25 is positioned at an antinode of a standing wave generated in the resonator. That light-emitting peak wavelength is 650 nm. Furthermore, the GaInP single quantum well active layer 25 is doped with $8\times10^{17}$ cm$^{-3}$ of Si.

Figure 7A:
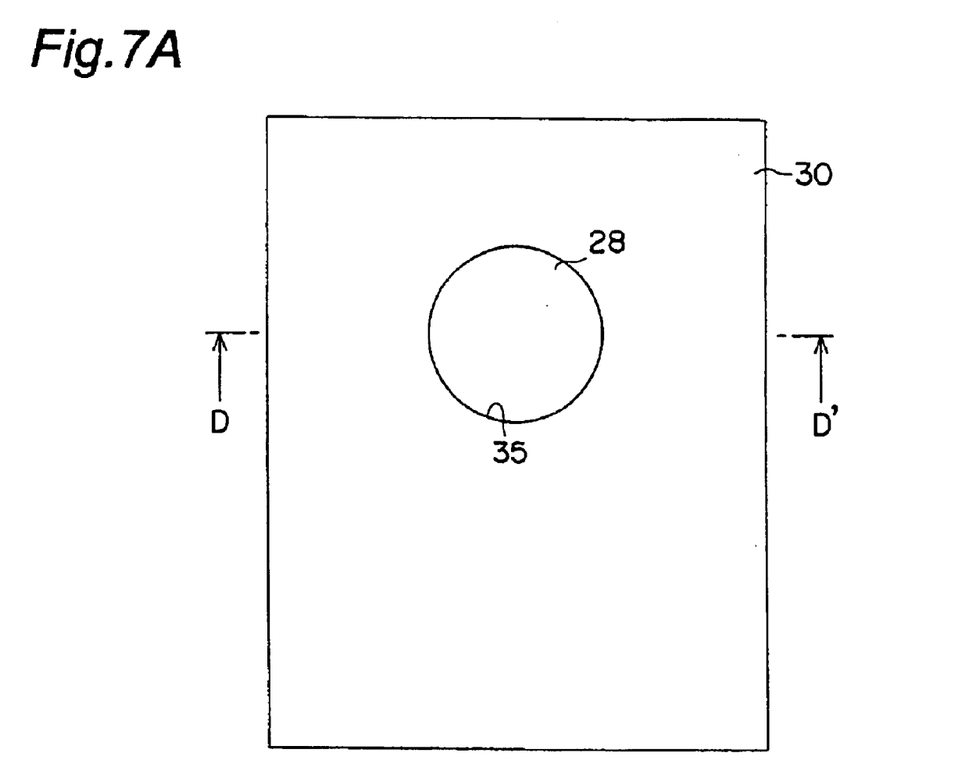
FIGS. 7A and 7B show a state in which a current path is formed in an n-type GaAs current constriction layer and an n-type AlGaInP protection layer as shown in FIG. 6.
Figure 7B:
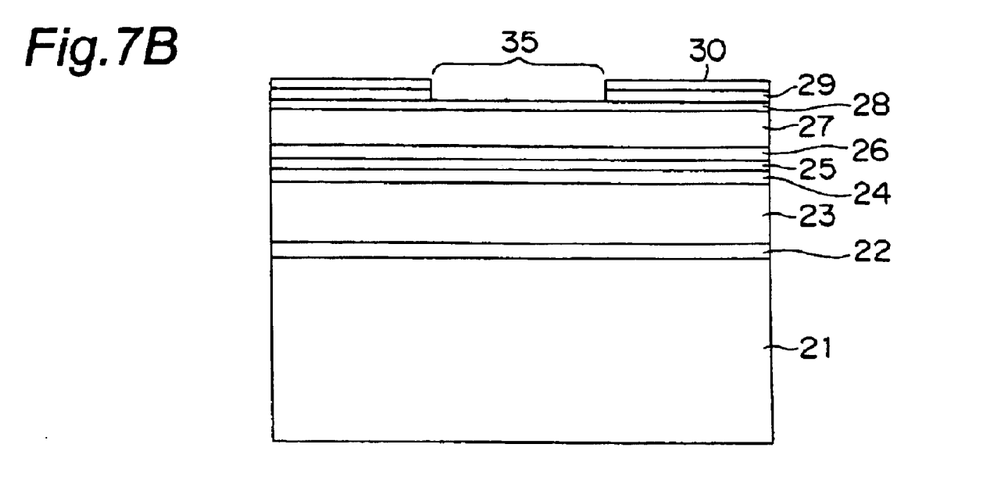

FIGS. 7A and 7B show a state that in which a current path is formed on the n-type GaAs current constriction layer 29 and the n-type AlGaInP protection layer 30 shown in FIG. 6. It is noted that FIG. 7A is a plan view and that FIG. 7B is a cross sectional view along line D–D' shown in FIG. 7A. As shown in FIG. 6, the n-type GaAs cap layer 31 is formed and then the n-type GaAs cap layer 31 is removed by etching using a sulfuric acid/hydrogen peroxide etchant. Subsequently, a current path 35 having a circular shape of 70 μm φ, which reaches the p-type AlGaInP etching stop layer 28, is formed in part of the n-type AlGaInP protection layer 30 and the n-type GaAs current constriction layer 29 by photolithography and etching using a thermal phosphoric acid etchant and a sulfuric acid/hydrogen peroxide etchant.

Subsequently, as shown in FIG. 5B, the p-type AlGaAs current diffusion layer 32 is re-grown on the n-type AlGaInP protection layer 30 and p-type AlGaInP etching stop layer 28. AuZn/Mo/Au is then sputtered on the p-type AlGaAs current diffusion layer 32 and a surface electrode (33) is formed by photolithography and etching using an Au etchant and an ammonia/hydrogen peroxide etchant. The p-type electrode 33 can be obtained by thermal treatment. Subsequently, the exposed surface of the n-type GaAs substrate 21 is polished to a thickness of about 280 μm. AuGe/Au is deposited on the polished surface and thermal treatment is performed to form the n-type electrode 34. Thus, the semiconductor light-emitting device shown in FIGS. 5A and 5B is formed.

The structure of a multilayer reflection film in the semiconductor light-emitting device having the above constitution is the same as that of the first embodiment. However, in the first embodiment, an n-type GaAs substrate 1 tilted 2° from the plane orientation (100) in the [011] direction is used. In this embodiment, an n-type GaAs substrate 1 tilted 15° from the plane orientation (100) in the [011] direction is used. Therefore, a high quality mirror-finished surface can be obtained. As a result, reflectance of the multilayer reflection film 27 made of an AlGaInP material, which is disposed on the opposite side of the n-type GaAs substrate 21, can be improved from about 70% to about 75%. Furthermore, moisture resistance is not a problem.

The semiconductor light-emitting device having the above constitution was subjected to a 50-mA electrification test in an atmosphere at a temperature of 80° C. and a humidity of 85%. After 1000 hours, the obtained optical output was 90% of the initial optical output. Furthermore, the initial optical output was 2.2 mW at 30 mA. Hence, a sufficient optical output was obtained.

By setting the resonance wavelength longer than the active layer emission wavelength and resonating the wavelength in a direction diagonal to the substrate surface by the active layer peak wavelength, an optical output larger than in the first embodiment can be obtained. Furthermore, since the surface is provided with the p-type AlGaAs current diffusion layer 32, the optical output of the semiconductor light-emitting device in this embodiment increases in proportion to a supplied current up to about 4 mW. The optical output of the semiconductor light-emitting device in the first embodiment is 2.5 mW, which shows a saturated tendency when the current is increased to 40 mA. Furthermore, when a current of 30 mA is emitted, the operating voltage of the semiconductor light-emitting device in this embodiment is 2.2 V. The operating voltage of the semiconductor light-emitting device in the first embodiment is 2.3 V. That is, the operating voltage can be lowered by 0.1 V by the structure of the second embodiment. These are effects resulting from uniform injection of the current into the GaInP single quantum well active layer 25 by the p-type AlGaAs current diffusion layer 32.

Regarding the response characteristics, the rise and fall time was 2.1 nsec when the GaInP single quantum well active layer 25 was doped with Si, which was equivalent to 2.2 nsec in the case where Si was not doped.

Figure 8:
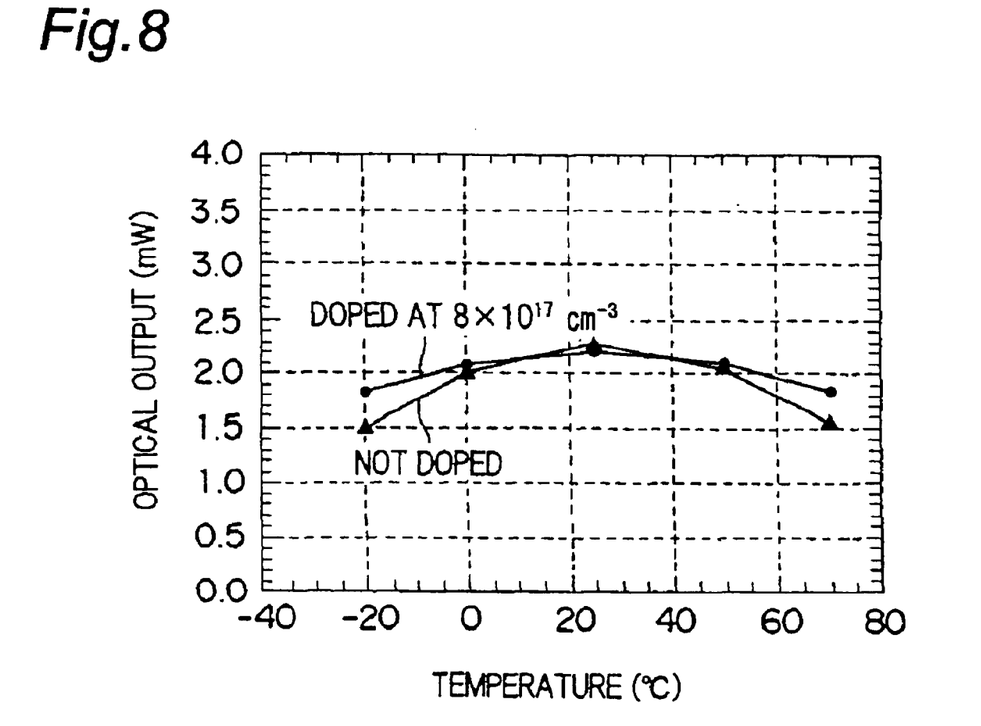
FIG. 8 shows temperature dependence of optical output in the semiconductor light-emitting device shown in FIGS. 5A and 5B.

Meanwhile, if the doping concentration becomes $2\times10^{17}$ cm$^{-3}$ or higher when the GaInP single quantum well active layer 25 is doped with Si, the half-value width of the light-emitting spectrum begins to increase. Furthermore, when the Si concentration is $8\times10^{17}$ cm$^{-3}$, as in the first embodiment, the half-value width of the light-emitting spectrum from the GaInP single quantum well active layer 25 similarly becomes 30 nm, which is about twice as wide as in the case where Si is not doped (15 nm). Consequently, as shown in FIG. 8, the value of the rate of the minimum optical output to the maximum optical output (minimum optical output/maximum optical output) is improved from about 0.6, when Si is not doped, to about 0.8 in the temperature range of −20 to 70° C. When the half-value width of the light-emitting spectrum from the GaInP single quantum well active layer 25 is 25 nm or greater, the "minimum optical output/maximum optical output" becomes 0.8 or higher. Thus, a light-emitting device with favorable temperature characteristics can be formed for optical transmissions.

As described above, in this embodiment, by using the active layer 25 having a single quantum well structure, the rise and fall time is 2.1 nsec. Hence, a high-speed response can be achieved. Furthermore, since the single quantum well active layer 25 is doped with Si at a concentration of $8\times10^{17}$ cm$^{-3}$, which is a concentration of $2\times10^{17}$ cm$^{-3}$ or higher, the half-value width of the light-emitting spectrum can be increased to 25 nm or greater. Therefore, the optical output change rate in the temperature range of −20 to 70° C. can be restricted to 20% or lower. Hence, the temperature dependence of the optical output can be reduced.

In the above embodiment, Si is used as an n-type impurity doped into the GaInP single quantum well active layer 25. However, the same effects can be obtained when Se, Te or the like is used. Therefore, by using the same type of impurity, which is not limited to Si, as in layers other than the GaInP single quantum well active layer 25, the number of kinds of impurities can be reduced.

Figure 9A:
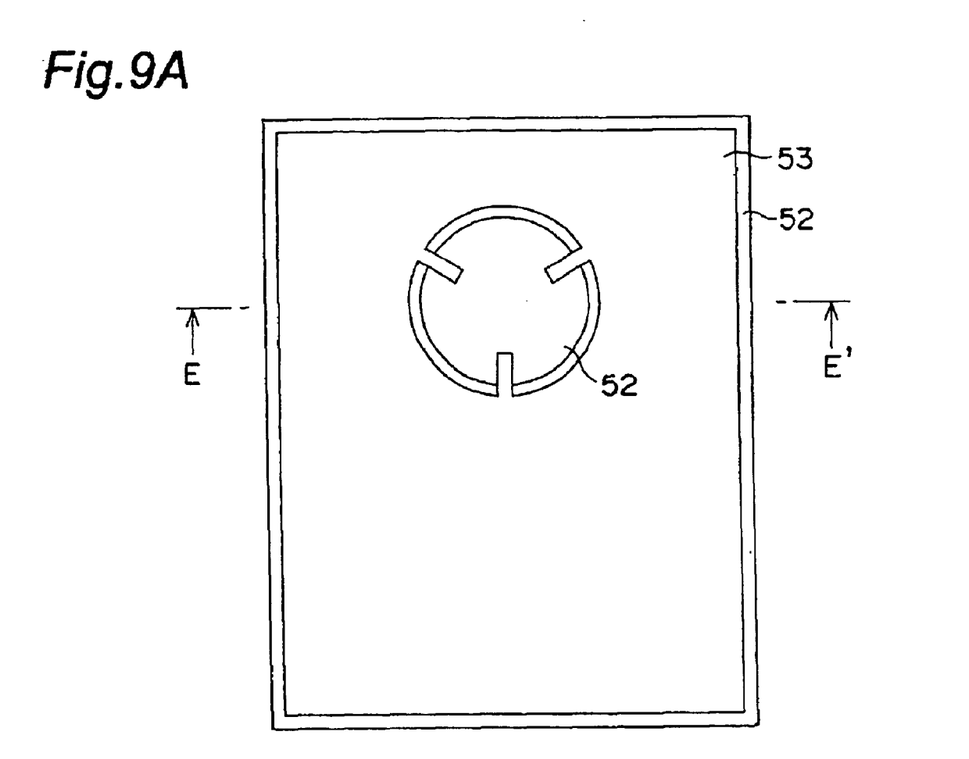
FIGS. 9A and 9B show a structure of a semiconductor light-emitting device of another embodiment of the invention.
Figure 9B:
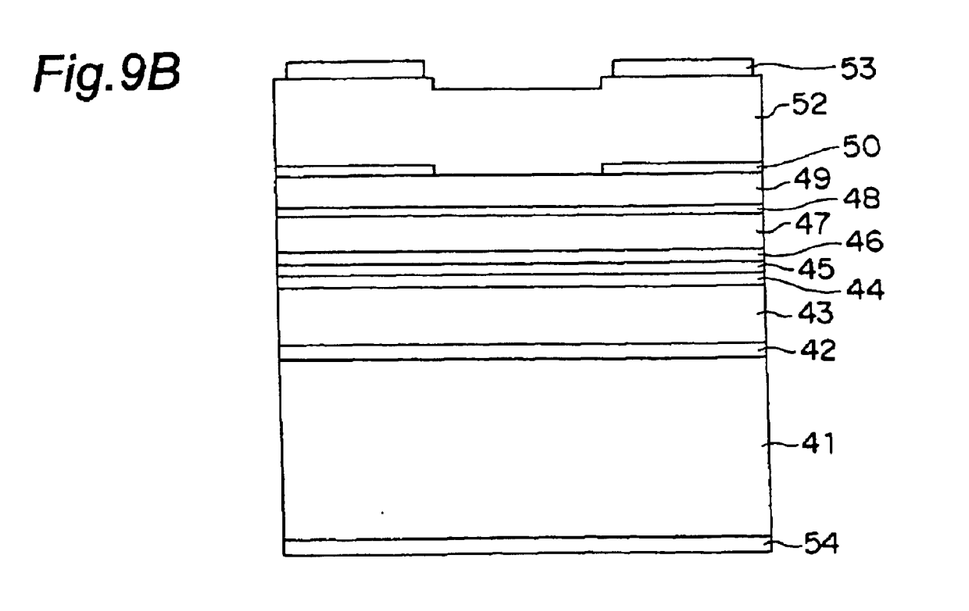

FIGS. 9A and 9B show a semiconductor light-emitting device according to a third embodiment. FIG. 9A is a plan view and FIG. 9B is a cross sectional view along line E–E' shown in FIG. 9A. In FIG. 9B, reference numeral 41 denotes an n-type GaAs substrate. Reference numeral 42 denotes an n-type GaAs buffer layer (1 μm). Reference numeral 43 denotes a DBR of 30.5 pairs of n-type AlAs and n-type $Al_{0.5}Ga_{0.5}As$. Reference numeral 44 denotes an n-type $(Al_{0.7}Ga_{0.3})_{0.5}In_{0.5}P$ first clad layer. Reference numeral 45 denotes an n-type GaInP single quantum well active layer wherein a well layer is $Ga_xIn_{1-x}P$ and a barrier layer is $(Al_{0.5}Ga_{0.5})_{0.5}In_{0.5}P$. Reference numeral 46 is a p-type $(Al_{0.7}Ga_{0.3})_{0.5}In_{0.5}P$ second clad layer. Reference numeral 47 denotes a DBR of 12 pairs of p-type $(Al_{0.2}Ga_{0.8})_{0.5}In_{0.5}P$ and p-type $Al_{0.5}In_{0.5}P$. Reference numeral 48 denotes a p-type AlGaInP intermediate layer (0.15 μm). Reference numeral 49 denotes a p-type GaP first current diffusion layer. Reference numeral 50 denotes an n-type GaP current constriction layer. Reference numeral 52 denotes a p-type AlGaInP second current diffusion layer. Reference numeral 53 denotes a p-type electrode. Reference numeral 54 denotes an n-type electrode.

Figure 10:
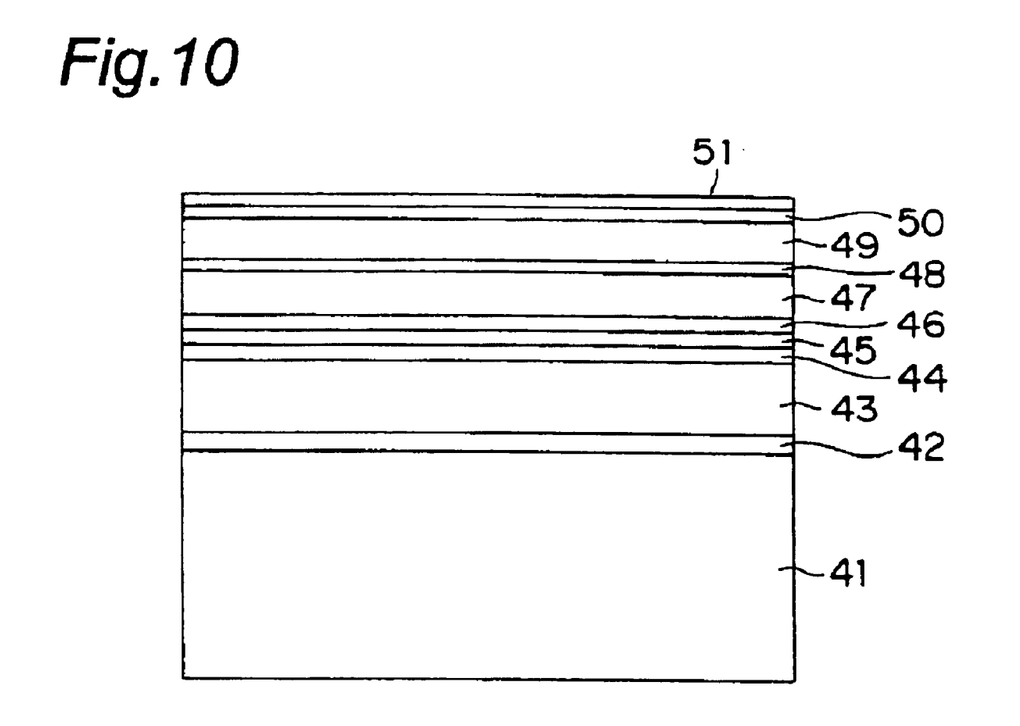
FIG. 10 is a cross sectional view showing a state in which the semiconductor light-emitting device shown in FIGS. 9A and 9B is formed up to an n-type GaAs cap layer.

FIG. 10 is a cross sectional view showing a state in the manufacturing process of the semiconductor light-emitting device shown in FIGS. 9A and 9B in which the n-type GaAs buffer layer 42 to the n-type GaP current constriction layer 50 are formed on the n-type GaAs substrate 41 and then an n-type GaAs cap layer 51 is formed. It is noted that this semiconductor light-emitting device is made of AlGaInP. As shown in FIG. 10, the n-type GaAs buffer layer 42 to the n-type GaAs cap layer 51 are successively laminated on the n-type GaAs substrate 41 tilted 15° from the plane orientation (100) in the [011] direction by the MOCVD method.

Here, in the DBR 43 of 30.5 pairs of n-type AlAs and n-type AlGaAs and the DBR 47 of 12 pairs of p-type AlGaInP and p-type AlInP, the center of the reflection spectrum is 660 nm. Furthermore, the resonator length is adjusted so that the resonance wavelength of the resonator formed by the two DBR 43, 47 is also 660 nm. Furthermore, the GaInP single quantum well active layer 45 is positioned at an antinode of a standing wave generated in the resonator. The light-emitting peak wavelength is 650 nm. Furthermore, the GaInP single quantum well active layer 45 is doped with $3 \times 10^{17}$ cm$^{-3}$ each of Si and Zn.

Figure 11A:
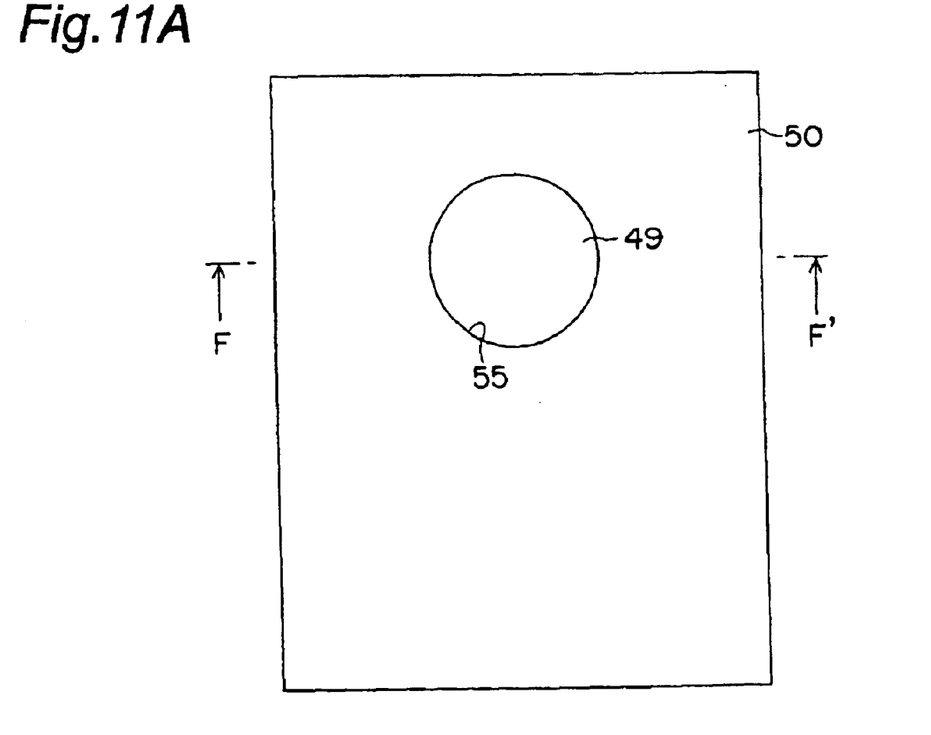
FIGS. 11A and 11B show a state in which a current path is formed in an n-type GaP current constriction layer as shown in FIG. 10.
Figure 11B:
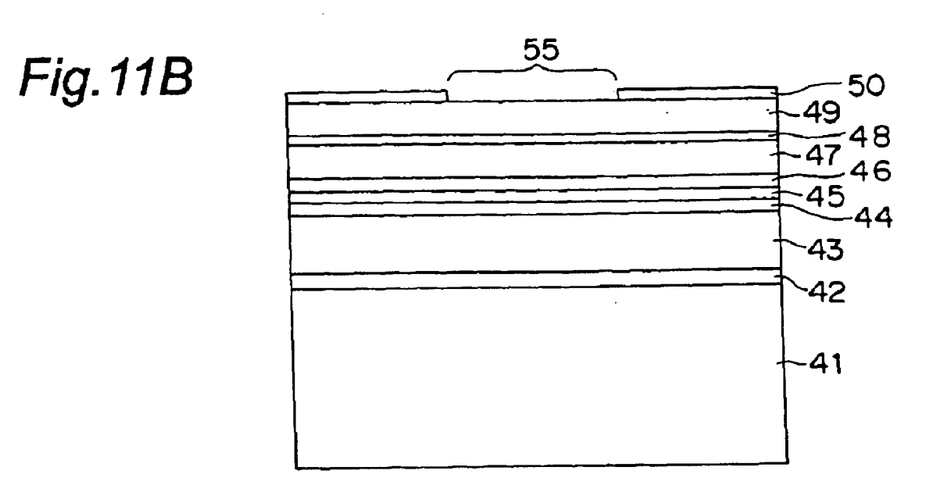

FIGS. 11A and 11B show a state in which a current path is formed in the n-type GaP current constriction layer 30 shown in FIG. 10. It is noted that FIG. 11A is a plan view and that FIG. 11B is a cross sectional view along line F–F' shown in FIG. 11A. As shown in FIG. 10, the n-type GaAs cap layer 51 is formed, and then the n-type GaAs cap layer 51 is removed by using a sulfuric acid/hydrogen peroxide etchant. Subsequently, a current path 55 having a circular shape of 70 μm φ, which reaches the p-type GaP first current diffusion layer 49, is formed in part of the n-type GaP current constriction layer 50 by photolithography and etching using the sulfuric acid/hydrogen peroxide etchant.

Subsequently, as shown in FIG. 9B, the p-type AlGaInP second current diffusion layer 52 is re-grown on the n-type GaP current constriction layer 50 and p-type GaP first current diffusion layer 49. Then, AuBe/Mo/Au is deposited on the p-type AlGaInP second current diffusion layer 52. A surface electrode (53) is formed by patterning with photolithography. Then, the p-type electrode 53 can be obtained by thermal treatment. Subsequently, the exposed surface of the n-type GaAs substrate 41 is polished to a thickness of about 280 μm. AuGe/Au is deposited on the polished surface and thermal treatment is performed to form the n-type electrode 54. Thus, the semiconductor light-emitting device shown in FIGS. 9A and 9B is formed.

The semiconductor light-emitting device having the above constitution was subjected to a 50-mA electrification test in an atmosphere at a temperature of 80° C. and a humidity of 85%. After 1000 hours, the obtained optical output was 90% of the initial optical output. Furthermore, the initial optical output was 2.2 mW at 30 mA. Hence, a sufficient optical output was obtained. Furthermore, by setting the resonance wavelength longer than the active layer emission wavelength and resonating the wavelength in the direction diagonal to the substrate surface by the active layer peak wavelength, as in the second embodiment, an optical output larger than in the first embodiment can be obtained. Furthermore, since the surface is provided with the p-type AlGaInP second current diffusion layer 52, the optical output of the semiconductor light-emitting device in this embodiment increases in proportion to a supplied current until about 4 mW is reached. Furthermore, the operating voltage of the semiconductor light-emitting device in this embodiment is also 2.2 V, as in the second embodiment.

Regarding the response characteristics, the rise and fall time was 2.1 nsec when the GaInP single quantum well active layer 45 was doped with Si and Zn, which was equivalent to 2.2 nsec in the case where Si and Zn were not doped.

Meanwhile, the GaInP single quantum well active layer 45 is doped with both Si and Zn (that is, both an n-type impurity and a p-type impurity). In this case, when each doping concentration is equal to or higher than $7 \times 10^{16}$ cm$^{-3}$, which is lower than $2 \times 10^{17}$ cm$^{-3}$ in the first and second embodiments where either the n-type or p-type impurity is doped, the half-value width of the light-emitting spectrum begins to increase. Furthermore, when each doping concentration of Si and Zn is $3 \times 10^{17}$ cm$^{-3}$, the half-value width of the light-emitting spectrum from the GaInP single quantum well active layer 45 is about 30 nm. This is about twice as wide as when doping is not performed (15 nm). Consequently, as in the second embodiment, the value of the rate of the minimum optical output to the maximum optical output (minimum optical output/maximum optical output) is about 0.8 in the temperature range of −20 to 70° C. Hence, a light-emitting device having favorable temperature characteristics for optical transmissions can be obtained. Furthermore, the doping concentration into the GaInP single quantum well active layer 45 can be lowered.

In the above embodiment, Si and Zn are used as an n-type impurity and a p-type impurity doped into the GaInP single quantum well active layer 45. The same effects can be obtained when an n-type impurity such as Se, Te or the like and a p-type impurity such as Mg, Be, C or the like are used. Therefore, by using the same impurity type, which is not limited to Si and Zn, as used in layers other than the GaInP single quantum well active layer 45, the number of kinds of impurities can be reduced.

As described above, according to the above embodiments, by doping the quantum well active layer with impurities, the half-value width of the light-emitting spectrum is increased.

Hence, the temperature dependence of the optical output can be reduced. Therefore, the optical output is not decreased even in high temperatures. That is, a light-emitting device having a plurality of quantum well layers can be applied to a light source for a display.

Furthermore, in the above embodiments, since the resonant cavity-type structure is applied to the single quantum well active layer 5, 25, 45, a high-speed response can be achieved. Furthermore, as described above, since the single quantum well active layer 5, 25, 45 is doped with impurities, the temperature dependence of the optical output can be reduced to improve performance. Therefore, as in the above embodiments, a light-emitting device in which the resonant cavity-type structure is applied to the single quantum well active layer doped with the impurities is a suitable light source for optical communications.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor light-emitting device comprising:
a resonator consisting of a pair of multilayer reflection films formed with a predetermined gap therebetween on a semiconductor substrate; and
a quantum well active layer at a position of an antinode of a standing wave generated in the resonator, wherein
the quantum well active layer is doped with an impurity.

2. The semiconductor light-emitting device according to claim 1, wherein the quantum well active layer is a single quantum well active layer.

3. The semiconductor light-emitting device according to claim 1, wherein the impurity includes both a p-type impurity and an n-type impurity.

4. The semiconductor light-emitting device according to claim 3, wherein each concentration of the p-type impurity and the n-type impurity is 7×1016 cm-3 or higher.

5. A semiconductor light-emitting device comprising:
a resonator consisting of a pair of multilayer reflection films formed with a predetermined gap therebetween on a semiconductor substrate; and
a quantum well active layer at a position of an antinode of a standing wave generated in the resonator, wherein
the half-value width of the light-emitting spectrum by the quantum well active layer is 25 nm or greater, wherein the quantum well active layer is a single quantum well active layer.

6. A semiconductor light-emitting device comprising:
a resonator consisting of a pair of multilayer reflection films formed with a predetermined gap therebetween on a semiconductor substrate; and
a single quantum well active layer at a position of an antinode of a standing wave generated in the resonator, wherein
the rate of minimum optical output to the maximum optical output in the temperature range of −20° C. to 70° C. is 0.8 or higher.

7. The semiconductor light-emitting device according to claim 1, wherein the semiconductor substrate is a GaAs substrate.

8. The semiconductor light-emitting device according to claim 5, wherein the semiconductor substrate is a GaAs substrate.

9. The semiconductor light-emitting device according to claim 6, wherein the semiconductor substrate is a GaAs substrate.

10. The semiconductor light-emitting device according to claim 7, wherein the quantum well active layer is made of $Al_yGa_zIn_{1-y-z}P$ ($0 \leq y \leq 1, 0 \leq z \leq 1$).

11. The semiconductor light-emitting device according to claim 8, wherein the quantum well active layer is made of $Al_yGa_zIn_{1-y-z}P$ ($0 \leq y1, 0 \leq z \leq 1$).

12. The semiconductor light-emitting device according to claim 9, wherein the single quantum well active layer is made of $Al_yGa_zIn_{1-y-z}P$ ($0 \leq y \leq 1, 0 \leq z \leq 1$).

13. The semiconductor light-emitting device according to claim 1, wherein a semiconductor layer including the multilayer reflection film and the single quantum well active layer is formed by a metal organized chemical vapor deposition method.

14. The semiconductor light-emitting device according to claim 5, wherein a semiconductor layer including the multilayer reflection film and the single quantum well active layer is formed by a metal organized chemical vapor deposition method.

15. The semiconductor light-emitting device according to claim 6, wherein a semiconductor layer including the multilayer reflection film and the single quantum well active layer is formed by a metal organized chemical vapor deposition method.

* * * * *